(12) United States Patent
Martineau et al.

(10) Patent No.: US 6,177,799 B1
(45) Date of Patent: Jan. 23, 2001

(54) RECHARGEABLE BATTERY ELECTRODE TESTING DEVICE

(75) Inventors: Daniel Martineau, Hull; Zbigniew S. Wronski, Gloucester, both of (CA)

(73) Assignee: Her Majesty the Queen in right of Canada, as represented by the Minister of Natural Resources, Ottawa (CA)

( * ) Notice: Under 35 U.S.C. 154(b), the term of this patent shall be extended for 0 days.

(21) Appl. No.: 09/489,334

(22) Filed: Jan. 21, 2000

(51) Int. Cl.[7] .................... G01N 27/416; H01M 10/48
(52) U.S. Cl. ................................. 324/425; 429/90
(58) Field of Search ................. 324/425; 429/90

(56) References Cited

U.S. PATENT DOCUMENTS

| | | |
|---|---|---|
| 4,076,906 | 2/1978 | Jensen . |
| 4,377,787 | 3/1983 | Kikuoka et al. . |
| 5,348,813 | 9/1994 | Bohmer et al. . |
| 5,360,682 | 11/1994 | Bohmer . |
| 5,438,249 * | 8/1995 | Chang et al. ............... 324/433 |
| 5,569,556 | 10/1996 | Bohmer . |

FOREIGN PATENT DOCUMENTS

| | | |
|---|---|---|
| 2000873 | 10/1990 | (CA) . |
| 2139855 | 1/1994 | (CA) . |

* cited by examiner

*Primary Examiner*—Peter S. Wong
*Assistant Examiner*—Gregory J. Toatley, Jr.
(74) *Attorney, Agent, or Firm*—Robert A. Wilkes (57) ABSTRACT

A testing device which measures minute changes in battery electrode thickness due to repeated charge/discharge cycles. The testing device uses a moving wall to detect changes in electrode dimensions, typically thickness. The moving wall is adjacent a surface of the electrode, and is connected a sensor that measures wall displacement induced by electrode dimensional changes. Also included in the testing device is a thermocouple that senses the temperature of the device, allowing the data sampling and processing means to correct for thermal expansion/contraction during operation. The testing device can be used during the battery cycling as it does not interfere with the charge/discharge/recharge process. The testing device can be used to measure either a single electrode, or a plurality of electrodes assembled into an electrode stack and incorporated either into a test cell or into a working battery.

27 Claims, 8 Drawing Sheets

RECHARGEABLE BATTERY ELECTRODE TESTING DEVICE

FIELD OF INVENTION

This invention concerns a testing device which can measure in real-time minute changes in electrode dimensions, in particular electrode thickness, due to repeated recharge and discharge cycles in either a rechargeable battery cell, or in a test cell used for testing either a single electrode, or a set of electrodes assembled into an electrode stack. More particularly, this invention concerns a testing device for use with NiCd rechargeable batteries.

DESCRIPTION OF THE PRIOR ART

There has been a recent increase in activity in the design and construction of rechargeable batteries. Both wet cell and dry cell batteries are being studied as a consequence of the increasing need for clean air vehicles such as electric cars. It is well known that in rechargeable batteries, particularly of the NiCd type, redox cycling of the electrode material, coupled with an exchange of certain chemical moieties with the electrolyte, induces dimensional changes of the electrode active mass. This causes reversible mechanical strain and irreversible mechanical degeneration of the electrode material. By studying the behaviour of the electrode through repeated cycles of charge and discharge, one can optimize the chemical formulation and design of electrodes. In a related area, the results of such studies can lead to optimized battery charge/discharge/recharge procedures. Such procedures can minimize the electrode swelling and thereby maximize the cycle life of a battery. While there are no known devices which can measure the swelling of electrodes during charge/discharge/recharge cycles, devices have been described which take advantage of the electrode swelling phenomenon to indicate the condition of a battery.

CA 2,139,855 discloses an apparatus for testing the internal pressure of sealed rechargeable electrochemical cells during operation. However, this apparatus only tests for the pressure within the cell and not the electrode thickness within the cell.

U.S. Pat. No. 4,076,906 issued to Jensen, takes advantage of the electrode swelling phenomenon to determine the condition of a battery cell. An indicator is described with a generally triangular cross-section, which is captive between one side of an electrode and a transparent wall of the battery. As the battery loses charge, the electrode swells, thereby pushing the indicator against the wall. The more the battery loses charge, the larger the degree of swelling and thus, the further the indicator is pressed against the wall. Each time the indicator is pressed to the wall, it leaves a mark visible from the outside of the battery. The marks indicate the condition of the battery: the greater the number of marks, the lesser the charge level of the battery.

While the above devices are useful, neither of them provide a means to test and record, for example by means of a suitable digital recording means, the dimensional changes, typically the thickness, of an electrode as it is repeatedly cycled through charge/discharge/recharge cycles. Also, the above devices test and indicate an extrinsic quality of the battery, namely its charge. What is required is a device that tests an intrinsic quality of an electrode, namely its response to repeated charge/discharge/recharge cycles.

SUMMARY OF THE INVENTION

The present invention seeks to provide a testing device that can measure minute changes in at least one dimension of an electrode, or in at least one dimension of a plurality of electrodes assembled into an electrode stack, while the electrode, or electrode stack, is being cycled. The electrode, or plurality of electrodes assembled into an electrode stack, can be part of either a commercial battery or an experimental battery. In a preferred embodiment, the testing device measures thickness changes, either averaged over the whole surface of an electrode, or at at least one selected locus on the electrode surface. The testing device also functions while the battery is in use, and does not interfere with the normal charge/discharge/recharge cycle.

Thus in a preferred embodiment, the present invention seeks to provide a testing device for measuring changes in the thickness of either an electrode, or an electrode stack, for a battery undergoing repeated charge/discharge/recharge cycling comprising:

a container having a cavity containing the electrode, or the electrode stack, and a suitable electrolyte, a first and a second pressure plate, each in contact with and supporting at least the periphery of each side of the electrode, or of the electrode stack, a moveable wall member adjacent to and maintained in contact with at least a portion of one surface of the electrode, or of the electrode stack, and supported by the first pressure plate, a temperature sensing means for sensing the temperature of the device, a wall member displacement detection means connected to the moveable wall, and a data processing means connected to both the detection means and the temperature sensing means.

In an alternative embodiment, the present invention seeks to provide a testing device for measuring dimensional changes in at least one fixed electrode within a rechargeable battery cell having a casing, the testing device comprising:

a moveable wall member adjacent to and maintained in contact with at least a portion of a surface of the at least one fixed electrode, a wall member displacement detection means connected to the moveable wall, a temperature sensing means for sensing the temperature of the device, and a displacement measurement means outside the battery cell connected to the detection means.

Preferably, the battery cell is of the NiCd type.

Preferably, the fixed electrode is carried by an interior surface of the battery cell casing.

Preferably, the data processing means includes a suitable computer based device constructed and arranged to process the data provided by the detection means and the temperature sensing means. More preferably, the data processing means processes the data provided by the temperature sensing means to provide a thermal expansion correction value to the data provided by the detection means.

Preferably, the temperature sensing means is a thermocouple.

Conveniently, the detection means is magnetic. Conveniently, a magnetic detection means comprises a linear voltage differential transformer.

Alternatively, the detection means is optical. Conveniently, an optical detection means comprises a laser.

Alternatively, the detection means is electrical. Conveniently, an electrical detection means comprises a variable capacitor associated with the moveable wall.

Preferably, the moveable wall is a flexible membrane. Alternatively, the moveable wall is a bellows structure.

Preferably the testing device includes means to monitor an electrolyte level within the battery.

Preferably, the detection means is supported by the container including the cavity. More preferably, the supporting means together with the container comprises a monolithic block of material of suitable shape. Most preferably, the monolithic block of material is composed of polytetrafluoroethylene.

The advantages of the present invention are numerous. The testing device allows for the evaluation of electrodes either in a testing device, or in the battery itself, during repeated charge/discharge/recharge cycles. Although the testing device is theoretically capable of monitoring any of the dimensions of an electrode, in practise it is more meaningful to monitor electrode thickness. For a relatively small area electrode, the measurements will generally be taken over more or less the full surface area. For a larger electrode it is contemplated that the measurements will be taken at at least one location, and if desired at several locations, on the electrode surface. It is also contemplated that the testing device can be used to monitor dimensional changes, for example over-all thickness changes often loosely called "swelling", of a plurality of electrodes assembled into a stack of electrodes in a multi-electrode stacked battery. When assessing an electrode stack within an assembled battery it is also advisable to allow any generated gas to escape easily. Additionally, it is contemplated that a testing device can be provided to monitor each of the electrodes in a multiple cell battery, with the derived information being combined and processed by a single data processor. It is also contemplated that although the electrode will change dimensions more or less continuously, the data can be retrieved either continuously or at selected times from a suitable data storage means proximate the battery.

The testing device measures periodic variation in the thickness of the electrode over repeated cycles, and can do so to a high level of resolution; for example thickness changes of the order of one micron can be measured for an electrode having an overall thickness of 0.8 mm, and (as is discussed in more detail below) it is possible to differentiate between periodic reversible swelling during charge/discharge/recharge cycles and cumulative irreversible swelling. Another advantage of the invention results from the moveable wall concept. This permits monitoring changes in the thickness of electrodes being cycled in either flooded or starved conditions and in either open or closed cell configurations. When the system also includes a temperature sensing means, particularly a thermocouple, it is possible to compensate the testing device readings to remove the effects of thermal expansion of the testing device from the thickness readings, by providing the temperature information to the data processor.

In most cells, the electrolyte level is of importance. By including means to monitor the electrolyte level it is possible to include this information in the data retrieved from the testing device. If desired, it is then possible to connect an automated electrolyte replenishment system to the battery so that the electrolyte level is maintained. Alternatively, the data can be used as a way of monitoring the battery, and periodically replenishing the electrolyte.

It should also be noted that although the moveable wall has to be adjacent to and in contact with a surface of the electrode, it is nevertheless necessary to ensure that there is sufficient electrode surface area exposed to the electrolyte to ensure that the electrochemical reactions involved in the charge/discharge/recharge cycle can occur.

BRIEF DESCRIPTION OF THE DRAWINGS

A better understanding of the invention will be obtained by considering the detailed description below, with reference to the following drawings in which.

DETAILED DESCRIPTION OF THE INVENTION

Figure 1:
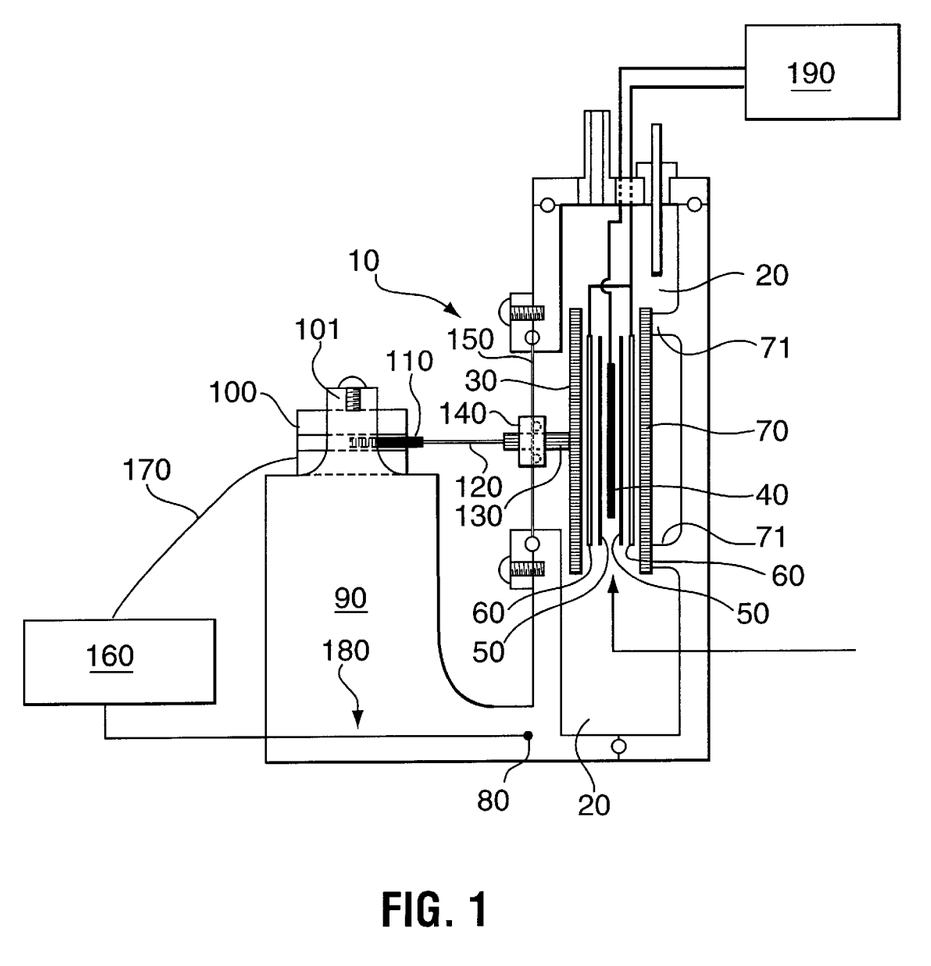
FIG. 1 is a schematic vertical cross-section of a testing device for testing a single electrode.
Figure 4:
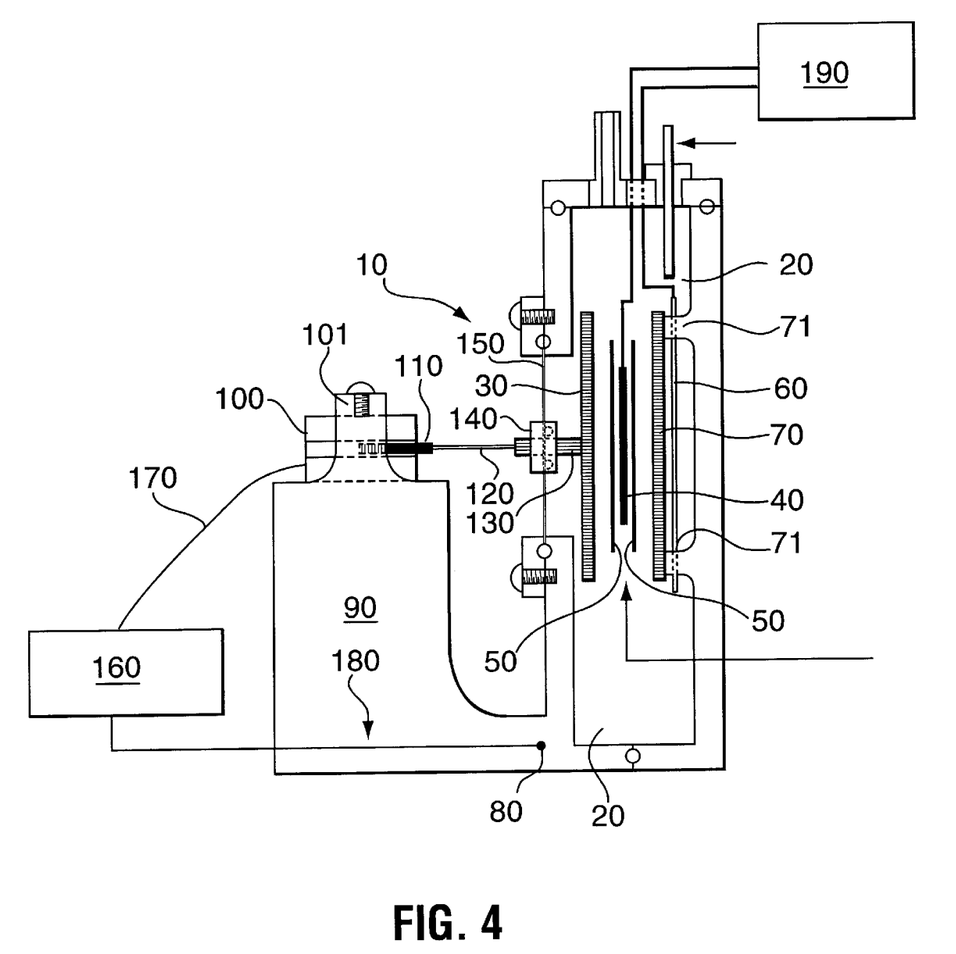
FIG. 4 is a vertical cross-section of a testing device with a half-cell configuration in accordance with the present invention.

Referring first to FIGS. 1 and 4, an embodiment of a testing device 10 in accordance with one embodiment of the present invention is shown, which comprises a testing device for evaluating an electrode under conditions simulating those obtaining in a working battery. The cell part of the device 10 has a cavity 20, which contains a movable pressure plate 30, the electrode 40 under test, separators 50, counter-electrode(s) 60, a fixed pressure plate 70, mounted for example on brackets such as at 71, and a thermocouple 80. The two pressure plates 30, 70 are perforated (not shown) to permit access of the electrolyte to the surfaces of the test electrode 40. A side extension 90 of the container 20 carries a linear voltage differential transformer (LVDT) 100, having a core 110 which is rigidly connected to the plate 30 by the linkage 120. The LVDT is retained by an adjustable mounting 101. In order to transmit dimensional changes in the electrode 40 to the LVDT 100, an extension 130 from the plate 30 extends through a seal 140 in a flexible membrane 150. A data sampling and processing system 160 is connected to the LVDT 100 and the thermocouple 80 in the extension 90 by suitable connections 170 and 180.

Figure 2:
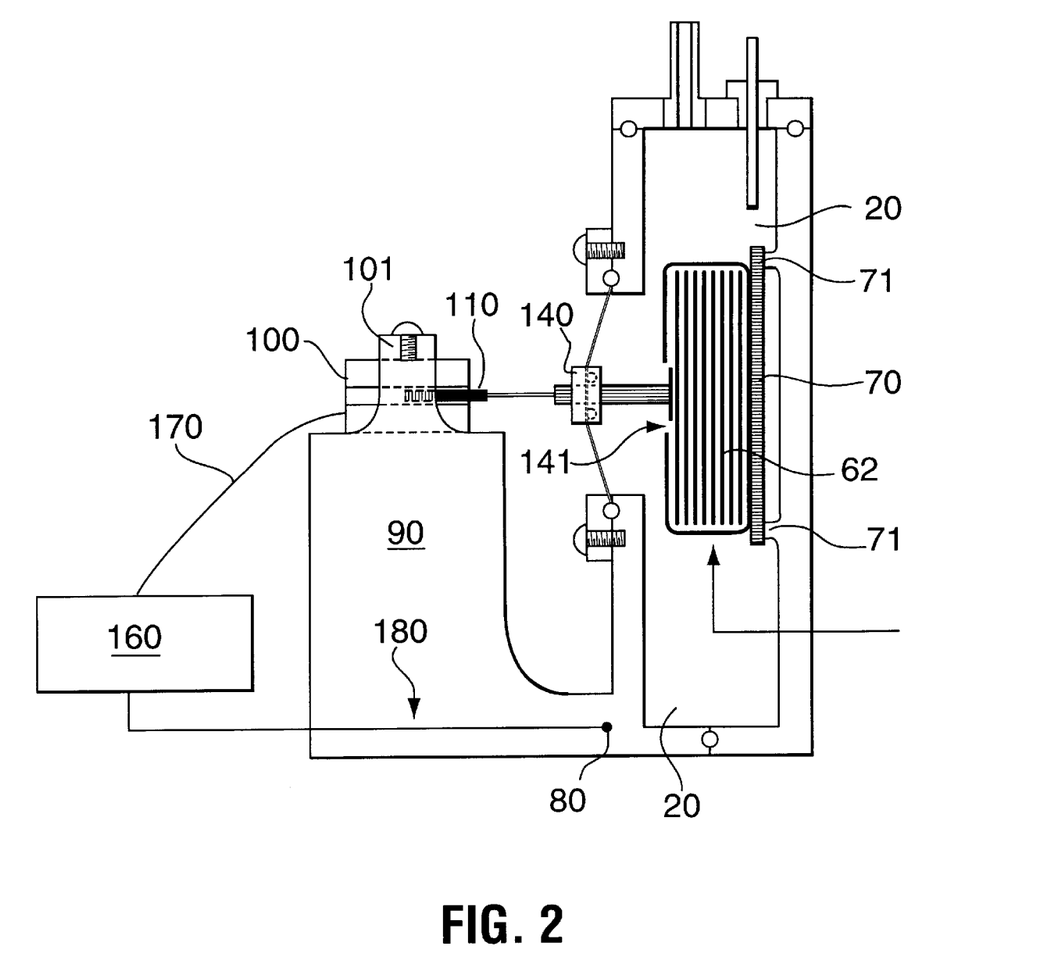
FIG. 2 is a schematic cross-section of a testing device for testing a multi-electrode battery.

A variation on the test device of FIGS. 1 and 4 is shown in FIG. 2. In FIG. 2 the test device is set up to monitor the overall thickness of a battery stack 62 within a commercial battery 61 (the connections to the battery and the battery cycler are omitted). Access to the stack is obtained through a suitably placed opening 141 in the battery case. As most commercial batteries operate in a starved condition, it is usually not necessary to ensure that the opening 141 is sealed about the connection 130. If it is necessary to seal the opening 141, it is then recommended that a gas outlet be provided elsewhere in the battery casing to accommodate any pressure changes that may result from the generation of any gas within the battery during the charge/discharge/recharge cycles. It is also possible to orient the whole test device so that any leakage from the opening is eliminated.

The LVDT 100 is a sensing device that can provide a signal indicating accurately very small displacements. In the LVDT, the magnetic field of a coil system is influenced by the position of the magnetic core 110, so that the output voltage from an LVDT is an indication of the position of the magnetic core relative to the coil system. LVDT devices are capable of detecting very small lateral movements of the core at the micron level.

The testing device operates as follows. The electrode 40 to be tested is placed in the testing device between the separators 50. The separators 50 are chemically resistant to the electrolyte solution, for which polytetrafluoroethylene is suitable. As shown in FIG. 1, the electrode 40 and the counter electrodes 60 are installed between the separators 50 if the counter electrodes 60 have no significant contribution to the overall swelling. However, if the swelling of the counter electrodes 60 is significant compared to the swelling behaviour of the electrode 40, in this arrangement only the combined swelling can be measured. This can be avoided by the arrangement shown in FIG. 4, in which the required counter-electrode 60 is installed elsewhere in the electrolyte in the cavity 20. The separators 50 shown in FIG. 1 if desired can also be omitted in the arrangement shown in FIG. 4. In the configuration of FIG. 4, with only the test electrode 40 between the pressure plates 30 and 70, any swelling of the counter-electrode 60 is not measured, and does not influence the results obtained.

Figure 3:
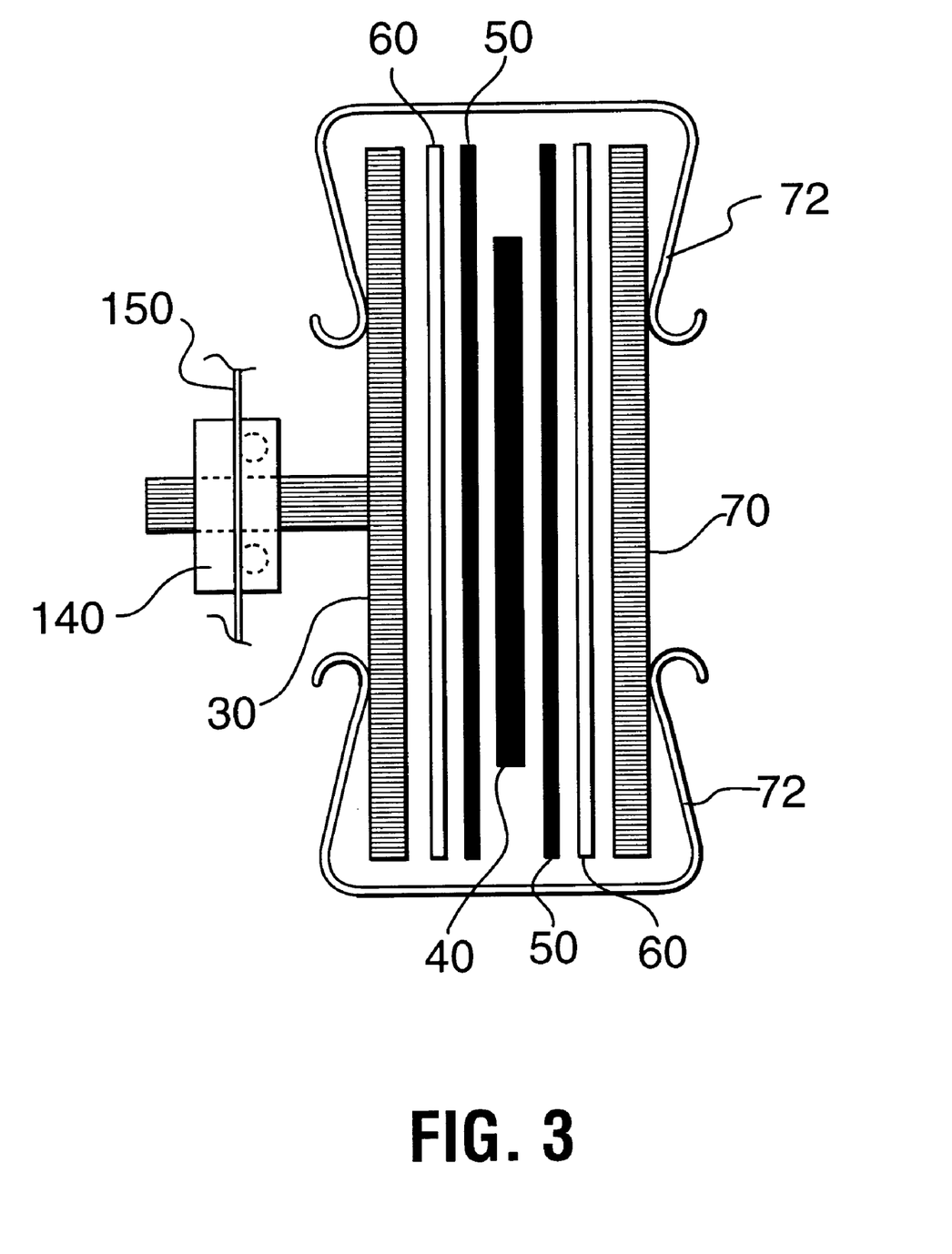
FIG. 3 is a schematic cross-section showing the clips used in the testing device of FIG. 1.

Pressure is applied to the pressure plates 30, 70 to hold the test electrode 40. A typical arrangement is shown in FIG. 3. In this arrangement, in sequence the pressure plate 30, a counter-electrode 60, a separator 50, the test electrode 40, a separator 50, a counter-electrode 60, and the pressure plate 70 are all held together by the spring clips 72. When this arrangement is used in the configuration of FIG. 4, the counter-electrodes 60 are not held by the clips, and, as noted, if desired the two separators 50 can be omitted. These clips are chosen both to be compatible with the electrolyte, and to allow the thickness of the test electrode to change during the charge/discharge/recharge cycles. The force exerted by each clip has to be previously measured so that the resulting applied pressure can be calculated.

The electrodes 40 and 60 are then connected to a battery cycler 190 and the position of the LVDT 100 is adjusted to obtain an output voltage that is as small as possible. The battery cycler can be a potentiostat/galvanostat. Prior to the cycling of the electrode 40, the data sampling system 160 has to be started. There are two separate conditions under which the electrode 40 can be tested. If the electrode 40 is to be tested in a starved condition, it is wetted with sufficient electrolyte before it is installed in the testing device. Additionally, some electrolyte or paste should be deposited in the bottom of the cavity 20 to saturate the gaseous phase inside the cavity 20 with liquid phase vapour from the electrolyte. If the electrode 40 is to be tested in a flooded condition, the cavity 20 is filled with sufficient electrolyte about 30 seconds after the data sampling system is started. This provides a baseline reading for the data sampling system 160.

After the first 25 seconds of data sampling, the position of the electrode surface, as indicated by the LVDT 100, is considered as the origin and used as the basis for further measurement. This value will be subtracted in real-time from all other displacement measurements. At the same time, the temperature measured is considered the base temperature. This base temperature will be subtracted, in real-time, from all subsequent temperature measurements. The difference obtained will be used to calculate the correction for thermal expansion or contraction of the test device. The proportion factor between the difference of temperature and the thermal correction to be applied is measured by performing data sampling on the testing device with the electrolyte, counter-electrode 60, and separators 50 all in place but with no working electrode 40. Once the proportion factor is known, the calculated correction will be added to all the measured positions of the electrode surface.

Once the above procedure has been followed, data sampling of thickness changes of the test electrode 40 and the temperature of the cavity 20 can commence.

With respect to the data sampling and processing system 160, a good quality analog to digital (A/D) converter is desirable. A low noise 16 bit A/D converter is the minimum requirement. The data sampling system needs to simultaneously sample three channels for each test cell. The first two channels monitor the input and output voltages of the LVDT. The third channel monitors any change in the temperature of the test device. This temperature measurement is used to correct for thermal contraction or expansion as noted above. To remove any noise in either the temperature or the displacement measurements, a moving average should be performed on each channel before any processing is done on the data. In the case where the test device output voltage could be influenced by its voltage input, both voltages should be measured and a correction calculation applied accordingly.

In FIGS. 1, 2 and 4, a low friction LVDT 100 is used as the appropriate displacement measuring device. The invention works best when the displacement measuring device is such that a transfer function, depending only on the displacement, can evaluated. A transfer function is the ratio between an input and an output measurement. For an LVDT, the transfer function is the ratio of the output voltage to the input voltage. An infinite resolution low friction LVDT has this characteristic and is therefore one of the best choices. The transfer function is used instead of the direct LVDT output voltage to determine the displacement of the electrode surface as the test electrode 40 is continuously cycled. The transfer function renders the end data independent of any small variations or drift in the input voltage. However, if one wishes to sense the position of the flexible wall with a signal which can be considered as a superposition of sinuous type signals, a complex transfer function can usually be defined and the phase difference can be used in addition to the amplitude ratio.

While an LVDT is contemplated as the ideal displacement measuring device, other means can also be used. The LVDT is ideal as it combines the displacement measuring device and the displacement sensor in one package. However, the displacement sensor can be separate from the displacement measurement device and the sensor can be a number of possible devices. Optical means, such as a laser, can also be used as the displacement sensor. Electrical means, such as a variable capacitor associated with the movable wall 30, can similarly be used.

It should be noted that it is preferable that the displacement sensor be integrated with the electrochemical cell that forms part of the testing device. This minimises the effects of thermal expansion of materials, such as the materials used for the cell and the sensor mounting. This can usually be accomplished by forming the cell and the sensor mount from a monolithic block of material, such as polytetrafluoroethylene, or any other material commonly used for battery cell casings. The use of a single monolithic block ensures that any thermal expansion is repeatable, and a suitable correction can be readily applied to the test device readings.

Figure 8:
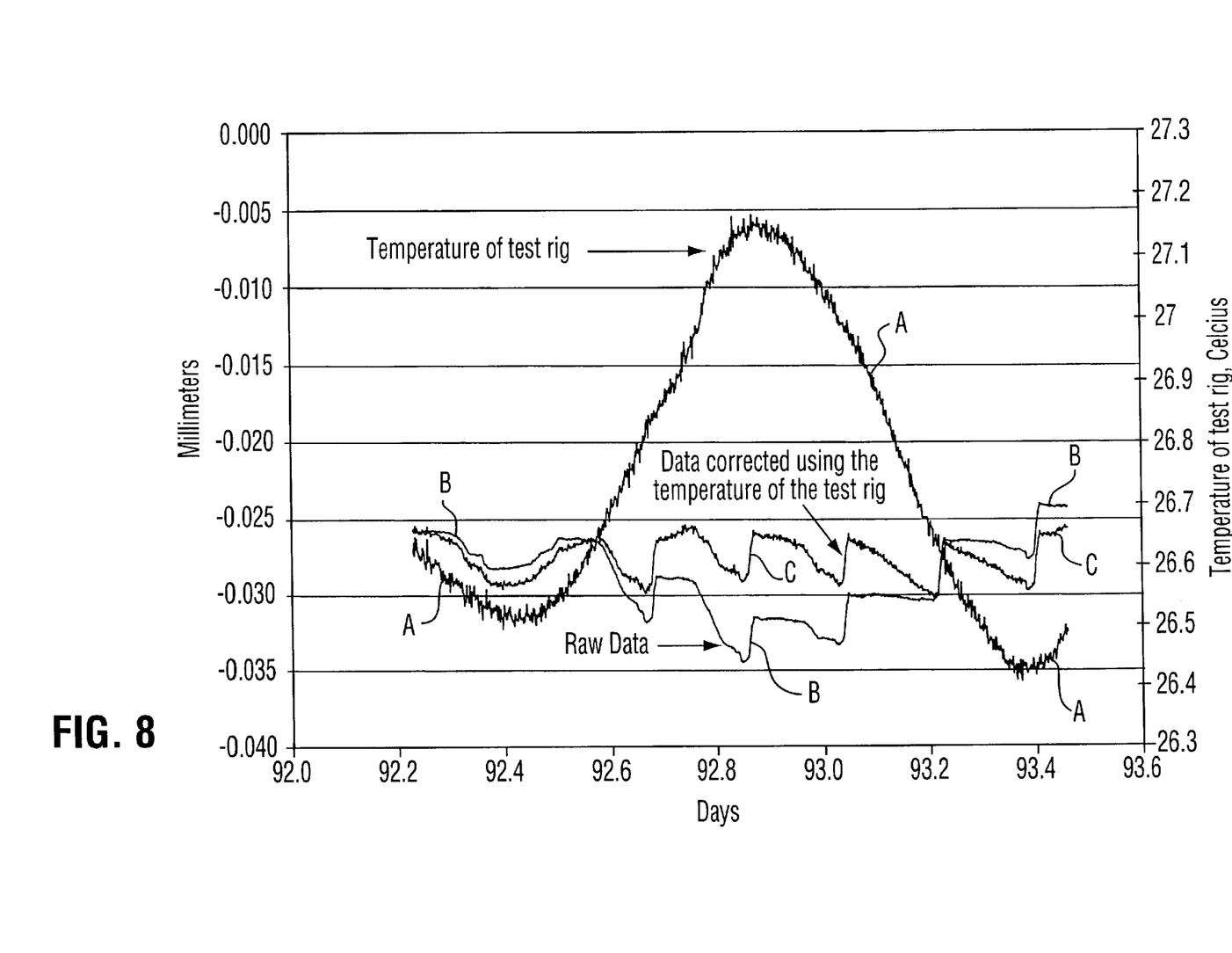
FIG. 8 is a plot showing the effects of temperature on the test device.

While the thermocouple 80 can be located anywhere on the testing device 10, the best readings are obtained with it embedded in the bottom part of the test device, between the cavity 20 and the sensor, such as the LVDT 100. Any changes in temperature in the test device can then be used to allow for any thermal expansion or contraction of the device in output from the data processor 160. In FIG. 8 a typical set of plots for test device temperature as plot A, non-corrected dimensional change as plot B, and corrected dimensional change as plot C, are shown. The test device used in this instance was a monolithic block of polytetrafluoroethylene as shown in FIG. 1.

The device of this invention can also be constructed to automatically refill itself with electrolyte. Electrically conductive pins chemically compatible with the electrolyte are used to monitor the electrolyte level, and the signals thereby obtained can be used in conjunction with an automatic filling device.

It should also be noted that the invention is not limited to single cell configurations. The concepts of this invention can be extended by arranging an array of electrodes, electrode stacks, or commercial batteries, which are attached to a multichannel data acquisition system.

EXAMPLE 1

A pasted nickel hydroxide positive electrode was made by incorporating a nickel hydroxide electrochemically active paste into a 40 mm wide, 120 mm long nickel metallic foam. The 1.6 mm thick foam had an areal density of 499.9 g per metre square yielding a porosity of 96.5% with pores in the range of 20–500 micrometers. The electrochemically active paste was made by mixing 20.0 g of battery grade spherical high density nickel hydroxide, 3.00 g of nickel filamentary powder and 1.50 g of cobalt fine powder with 8 ml of deionized water and 10.50 g of a plastic binder dissolved in a 1:1 water/ethanol solution. The plastic binder was an 80% hydrolysed polyvinylalcohol(PVA). The water/ethanol solution contained 1.173% by weight PVA. The commercial hydroxide used was a spherical, high-density type containing less than 1% Co and about 4% Zn. The addition of these two substances are known to prevent excessive swelling of hydroxides during cycling.

The nickel hydroxide paste was manually incorporated into the pores of the nickel metallic foam by means of a stainless steel spatula. Then, the pasted nickel foam was dried in an oven at 100° C. for one hour and calendered between two steel plates with a small rolling mill to produce pasted coupons having a thickness of 0.06 mm/gram. The calendering reduces the pasted coupon porosity and increases its mechanical integrity. Three round shaped electrodes were punched out from the pasted coupon and spot-welded to small nickel wires. The thickness of the resulting electrode was 0.828 mm, the area 7.98 cm$^2$ for a diameter of 31.88 mm and a mass of 2.13 g. The mass of nickel hydroxide in the electrode, indicates a capacity of 413.3 mA/hour.

The nickel hydroxide positive electrode was cycled in an open flooded half-cell configuration. The electrode was placed in a pouch made from a battery grade thin felt separator (PELLON FS 2225 from Freudenberg Nonwovens; this material is an equal parts mixture of polyethylene and polypropylene fibres with a fluorinated surface). The pouch was also covered on both side with a nylon grid to allow for any generated. gas to escape easily. The nylon grid used had 0.8 mm nylon filaments at a spacing of 7.87 filaments per centimetre. The electrode, with its felt pouch and nylon grid, was inserted inside a folded pressed nickel foam counter-electrode.

The half-cell containing the electrode was placed in the electrode testing device between the two perforated polytetrafluoroethylene pressure plates 30, 70. Pressure was applied to the two perforated plates by means of two 1" steel clips applying a pressure of 768 grams per square centimeter.

The electrodes were connected to an ARBIN model BT-2042 multichannel potentiostat/galvanostat used as a battery cycler. The input voltage of the LVDT 100 was precisely adjusted to 15.000 +/−0.005 volts, and the position of the LVDT 100 in its mounting 101 was adjusted so that the output voltage of the LVDT 100 was as close as possible to zero. The electronic devices used for this experiment were working for at least 24 hours before the start of this experiment. Five minutes after the data sampling was launched, 100 ml of an electrolyte solution of 30% w/w of potassium hydroxide and 1% w/w lithium hydroxide in deionised water was added to the cavity and charge/discharge/recharge cycling was initiated.

The measuring device part of the electrode testing device was an infinite resolution LVDT model L-400-2.5, the data sampling card installed on an IBM compatible computer was a low noise 16 bit A/D converter model WB-ASC16 and the data sampling software used was Workbench for Windows™ version 2.6. The data sampling was performed simultaneously on three channels at a rate of 10 Hz. A moving average of 20 seconds was used on each channel and the transfer function of the LVDT was used to determine the position of the surface of the electrode. The transfer function was evaluated from the average value of the input and output voltage of the LVDT. With the third channel of the data sampler, the temperature of the body of the electrode testing device was measured using a "T-type" thermocouple. The temperature value was used by the software to correct for any thermal expansion and/or contraction.

The electrode was cycled in the working testing device in the following way. After a soaking period of 24 hours, the electrode was activated with a current of 20.7 mA for 36 hours to oxidize the cobalt and charge the electrode. The electrode was then discharged with a current of 41.3 mA until the voltage of the electrode reached −0.8 volt using the nickel counter-electrode as a reference.

The regular cycling consisted of a regular charge to a capacity equal to 125% of the last discharge capacity. The electrode is always charged with a current of 103.3 mA. The electrode was discharged to a cut off voltage of −0.8 volts using a nickel counter electrode reference. The discharge current for the regular discharge is 413.3 mA and a slow discharge is performed every tenth cycle at a current of 82.7 mA.

The results were saved in ASCII files and the charts plotted with an electronic spreadsheet.

Figure 5:
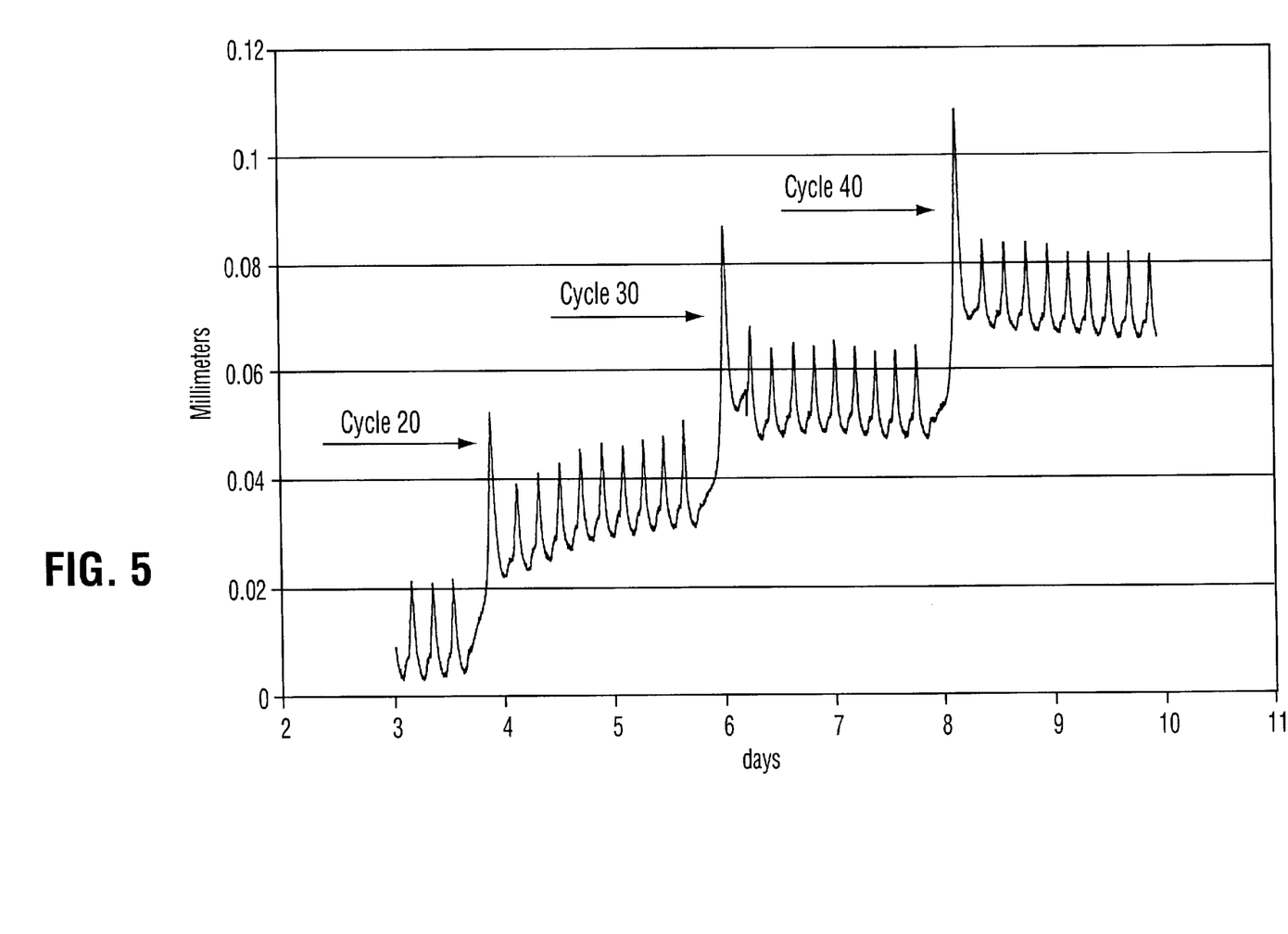
FIG. 5 is a plot of the swelling of a typical nickel hydroxide pasted electrode and illustrates the two modes of swelling.

FIG. 5 shows the swelling behavior of the electrode tested for cycles 20 to 49. The swelling amplitude is close to 20 microns for the regular cycling and about 50 microns for the cycle which contains the slow discharge at every tenth cycle. Also, the slow discharge at every tenth cycle causes some irreversible swelling while the swelling associated with the regular discharge is mostly reversible. Given that the swelling of the electrode is a well accepted cause of the electrode fading as the number of cycles increases, this type of plot is a powerful tool for the electrode/battery designer.

Figure 6:
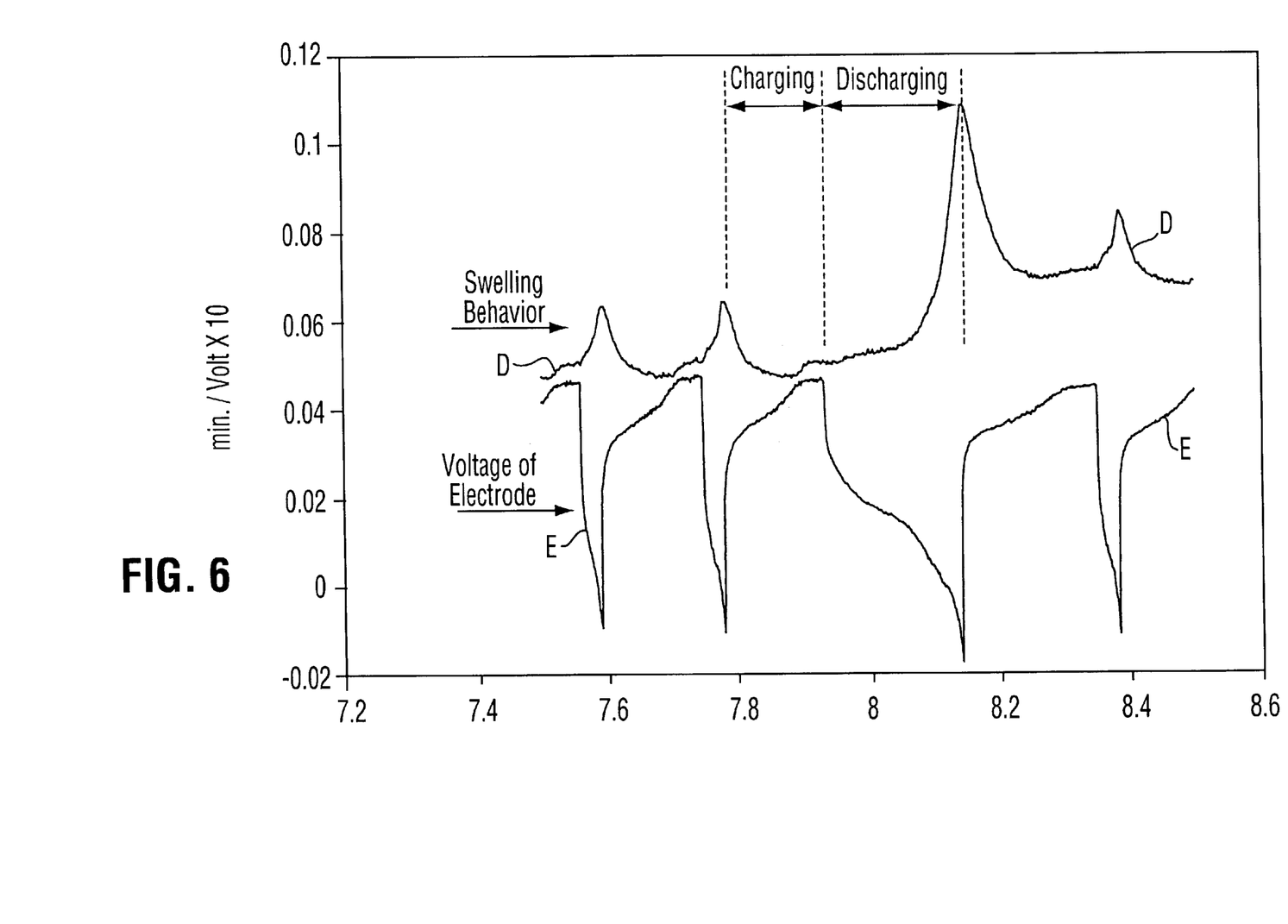
FIG. 6 shows the details of a typical electrode swelling pattern and relates them to observed voltage changes.

FIG. 6 shows the relation between the voltage of the electrode and its swelling behavior for cycles 38 to 41, the voltage having been measured against a Ni(OH)$_2$/NiOOH reference electrode. The swelling behavior (plot D) and the electrode voltage (plot E) correlate very well. These correlations can be used to understand some of the fundamental aspects of electrode swelling.

EXAMPLE 2

The second experiment is a simplified optimization experiment. For any optimization experiment a testing device array should be used. This makes it possible to investigate the effects of simultaneously varying two or more parameters. For the sake of simplicity, only the results from a two electrode testing device array with only one parameter varied is presented here.

Figure 7:
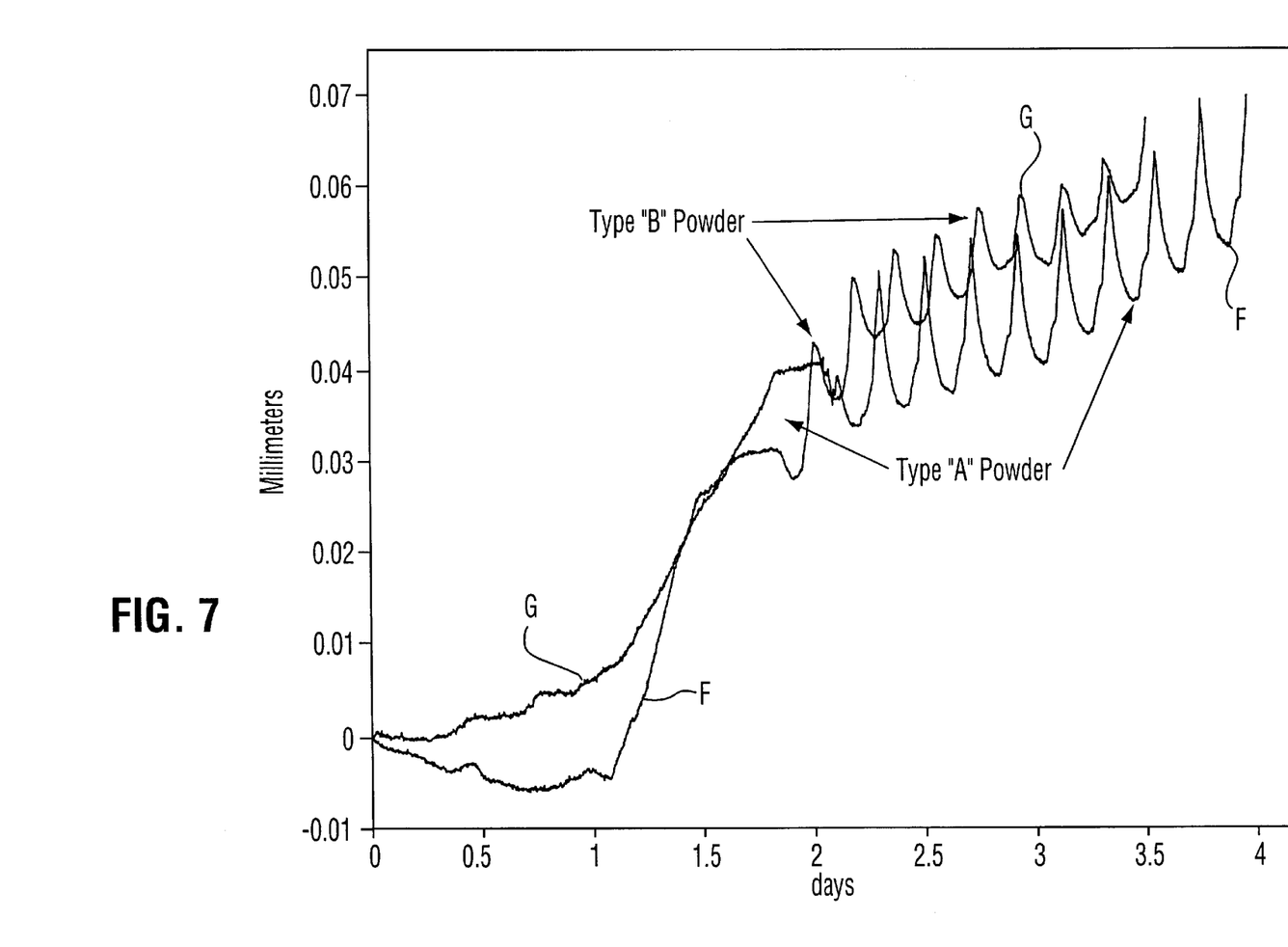
FIG. 7 is a plot of the swelling patterns of two electrodes made out of nickel hydroxide powders with differing levels of crystallinity.

FIG. 7 compares the swelling behavior of two types of electrodes. The type "A" electrode was made with a nickel hydroxide powder of lower crystallinity while type "B" was made with a nickel hydroxide of higher crystallinity; additionally the powder used in constructing the type "B" electrode has thinner crystals with larger diameter when compared with the lower crystallinity powder used to make the type "A" electrode. The electrodes were prepared and tested in the same manner as the electrode of Example 1.

The electrode made with the type "A" powder had a total mass of 1.906 g. From that mass, 1.519 g was due to the active mass. Of this mass, 1.24 g was nickel hydroxide, the remaining mass being composed of the same PVA binder as in Example 1, together with cobalt and nickel powders. The thickness of this electrode was 0.733 mm. This thickness yields an active paste linear density, across the thickness of the electrode, of 2.07 g/mm. The capacity of this electrode was evaluated as 356.81 mA/hr.

The electrode made with the type "B" powder had a total mass of 1.866 g. Of that mass, 1.506 g was due to an active mass of 1.22 g of nickel hydroxide, the remaining mass being composed of the same PVA binder as in Example 1, together with cobalt and nickel powders. The thickness of this electrode was 0.744 mm, yielding an active mass density of 2.02 g/mm. The capacity of this electrode was evaluated as 353.46 mA/hr. FIG. 7 shows the first cycles after the activation cycling. Although these electrodes had similar loading and were cycled in the same condition in similar electrolyte solutions, they exhibited a significant difference in swelling behavior. From FIG. 7, it can be seen that the type "A" electrode (plot F), made with the lower crystallinity powder, exhibited a reversible swelling of greater amplitude than the type "B" electrode (plot G). This difference in the swelling behavior could be related to the electrochemical performances of the powder. It is well known that a lower crystallinity powder yields superior performance in the case of nickel hydroxide electrodes.

We claim:

1. A testing device for measuring dimensional changes in at least one fixed electrode within a rechargeable battery cell having a casing, the testing device comprising:
   a moveable wall member adjacent to and maintained in contact with at least a portion of a surface of the at least one fixed electrode,
   a wall member displacement detection means connected to the moveable wall,
   a temperature sensing means for sensing the temperature of the device, and
   a displacement measurement means outside the battery cell connected to the detection means.

2. A device as claimed in claim 1 wherein the at least one fixed electrode is carried by an interior surface of the battery cell casing.

3. A device as claimed in claim 1 wherein the displacement measurement means includes a computer based device constructed and arranged to process the data provided by the detection means.

4. A device as claimed in claim 3 wherein the computer based device is further constructed and arranged to process the data provided by the temperature sensing means.

5. A device as claimed in claim 4 wherein the computer based device is constructed and arranged to process the data provided by the temperature sensing means to provide a thermal expansion correction value to the data provided by the detection means.

6. A device as claimed in claim 4 wherein the temperature sensing means is a thermocouple.

7. A device as claimed in claim 5 wherein the temperature sensing means is a thermocouple.

8. A device as claimed in claim 1 wherein the displacement detection means comprises a linear voltage differential transformer.

9. A device as claimed in claim 1 wherein the measured dimension is the thickness of the at least one electrode.

10. A testing device for measuring changes in the thickness of either an electrode, or an electrode stack, for a battery undergoing repeated charge/discharge/recharge cycling comprising:
    a container having a cavity containing the electrode, or the electrode stack, and a suitable electrolyte,
    a first and a second pressure plate, each in contact with and supporting at least the periphery of each side of the electrode, or of the electrode stack,
    a moveable wall member adjacent to and maintained in contact with at least a portion of one surface of the electrode, or of the electrode stack, and supported by the first pressure plate,
    a temperature sensing means for sensing the temperature of the device,
    a wall member displacement detection means connected to the moveable wall, and
    a data processing means connected to both the detection means and the temperature sensing means.

11. A device as claimed in claim 10 wherein the displacement measurement means includes a suitable computer based device constructed and arranged to process the data provided by the detection means.

12. A device as claimed in claim 11 wherein the computer based device is further constructed and arranged to process the data provided by the temperature sensing means.

13. A device as claimed in claim 12 wherein the computer based device is constructed and arranged to process the data provided by the temperature sensing means to provide a thermal expansion correction value to the data provided by the detection means.

14. A device as claimed in claim 12 wherein the temperature sensing means is a thermocouple.

15. A device as claimed in claim 13 wherein the temperature sensing means is a thermocouple.

16. A device as claimed in claim 10 wherein the detection means is optical.

17. A device as claimed in claim 16 wherein the optical detection means comprises a laser.

18. A device as claimed in claim 10 wherein the detection means is magnetic.

19. A device as claimed in claim 18 wherein the magnetic detection means comprises a linear voltage differential transformer.

20. A device as claimed in claim 10 wherein the detection means is electrical.

21. A device as claimed in claim 20 wherein the electrical detection means comprises a variable capacitor associated with the moveable wall.

22. A device as claimed in claim 10 wherein the moveable wall is a flexible membrane.

23. A device as claimed in claim 10 wherein the moveable wall is a bellows structure.

24. A device as claimed in claim 10 further including means to monitor an electrolyte level within the cavity.

25. A device as claimed in claim 10 wherein the detection means is supported by the container outside the cavity.

26. A device as claimed in claim 25 wherein the supporting means together with the container comprises a monolithic block of material.

27. A device as claimed in claim 26 wherein the monolithic block of material is composed of polytetrafluoroethylene.

* * * * *